(12) United States Patent
Sherbin et al.

(10) Patent No.: US 11,664,276 B2
(45) Date of Patent: May 30, 2023

(54) FRONT SIDE LASER-BASED WAFER DICING

(71) Applicant: Texas Instruments Incorporated, Dallas, TX (US)

(72) Inventors: Matthew John Sherbin, Dallas, TX (US); Michael Todd Wyant, Dallas, TX (US); Christopher Daniel Manack, Flower Mound, TX (US); Hiroyuki Sada, Beppu (JP); Shoichi Iriguchi, Beppu (JP); Genki Yano, Beppu (JP); Ming Zhu, Sichuan (CN); Joseph O. Liu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 769 days.

(21) Appl. No.: 16/205,692

(22) Filed: Nov. 30, 2018

(65) Prior Publication Data
US 2020/0176314 A1   Jun. 4, 2020

(51) Int. Cl.
| H01L 23/544 | (2006.01) |
| H01L 21/78 | (2006.01) |
| B23K 26/364 | (2014.01) |
| H01L 23/00 | (2006.01) |
| H01L 21/268 | (2006.01) |

(52) U.S. Cl.
CPC .......... H01L 21/78 (2013.01); B23K 26/364 (2015.10); H01L 21/268 (2013.01); H01L 23/562 (2013.01)

(58) Field of Classification Search
CPC ..... H01L 21/78; H01L 21/268; H01L 23/562; B23K 26/364
See application file for complete search history.

(56) References Cited

U.S. PATENT DOCUMENTS

| 5,151,389 A * | 9/1992 | Zappella | B28D 1/221 219/121.67 |
| 6,555,447 B2 * | 4/2003 | Weishauss | B28D 1/221 438/460 |
| 6,992,026 B2 * | 1/2006 | Fukuyo | C03B 33/082 438/797 |
| 7,566,635 B2 * | 7/2009 | Fujii | H01L 21/268 438/462 |

(Continued)

FOREIGN PATENT DOCUMENTS

WO   1255280 A2 *  11/2002

OTHER PUBLICATIONS

Ohmura et al., "Laser processing of doped silicon wafer by the Stealth Dicing", ISSM Paper: PT-O-086; (c) 2007 IEEE (Year: 2007).*

(Continued)

*Primary Examiner* — Ismail A Muse
(74) *Attorney, Agent, or Firm* — Yudong Kim; Frank D. Cimino

(57) ABSTRACT

A semiconductor die includes a substrate having a semiconductor surface layer bon a front side with active circuitry including at last one transistor therein and a back side. The sidewall edges of the semiconductor die have at least one damage region pair including an angled damage feature region relative to a surface normal of the semiconductor die that is above a damage region that is more normal to the surface normal of the die as compared to the angled damage feature region.

18 Claims, 3 Drawing Sheets

(56) References Cited

U.S. PATENT DOCUMENTS

| | | | | |
|---|---|---|---|---|
| 7,825,350 | B2* | 11/2010 | Fukuyo | B23K 20/233 219/121.72 |
| 8,108,998 | B2* | 2/2012 | Inada | B23K 26/38 29/890.1 |
| 8,361,828 | B1* | 1/2013 | Patterson | H01L 21/78 438/57 |
| 8,445,361 | B1* | 5/2013 | Lindsey, Jr. | H01L 21/78 257/620 |
| 8,664,089 | B1* | 3/2014 | Burghout | H01L 21/02076 438/460 |
| 8,815,705 | B2* | 8/2014 | Kato | B23K 26/0622 438/463 |
| 8,906,745 | B1* | 12/2014 | Lindsey, Jr | H01L 21/78 438/114 |
| 9,214,353 | B2* | 12/2015 | Yonehara | B23K 26/50 |
| 9,938,180 | B2* | 4/2018 | Abramov | B23K 26/359 |
| 10,079,169 | B1 | 9/2018 | Hooper et al. | |
| 2005/0199592 | A1* | 9/2005 | Iri | B23K 26/40 219/121.6 |
| 2005/0272223 | A1* | 12/2005 | Fujii | B23K 26/0622 438/459 |
| 2007/0111478 | A1* | 5/2007 | Komura | B28D 5/0011 257/E21.599 |
| 2009/0004828 | A1* | 1/2009 | Kobayashi | B28D 5/0011 257/E21.347 |
| 2011/0312157 | A1* | 12/2011 | Lei | H01L 21/822 438/462 |
| 2012/0100696 | A1* | 4/2012 | Nakamura | H01L 21/78 257/E21.599 |
| 2012/0329246 | A1* | 12/2012 | Finn | H01L 21/78 438/462 |
| 2014/0099777 | A1* | 4/2014 | Mackh | H01L 21/6836 438/463 |
| 2014/0117505 | A1* | 5/2014 | Mackh | H01L 23/29 257/620 |
| 2014/0179083 | A1* | 6/2014 | Buenning | B23K 26/53 438/463 |
| 2015/0011073 | A1* | 1/2015 | Lei | H01L 21/67207 438/462 |
| 2015/0079761 | A1 | 3/2015 | Lei et al. | |
| 2015/0162243 | A1* | 6/2015 | Kumar | H01L 21/3043 438/462 |
| 2018/0015569 | A1* | 1/2018 | Lin | B23K 26/53 |
| 2019/0006295 | A1* | 1/2019 | Tadano | H01L 21/6715 |
| 2019/0279902 | A1* | 9/2019 | Park | B23K 26/18 |
| 2020/0058550 | A1* | 2/2020 | Ono | B23K 26/40 |

OTHER PUBLICATIONS

Lei et. al., "Die singulation technologies for advanced packaging: A critical review", J. Vac. Sci. Technol. B 30(4), Jul./Aug. 2012 (c) 2012 American Vacuum Society. (Year: 2012).*

"Stealth Dicing Technology and Applications", Mar. 2006, Hamamatsu Photonics, Japan, https://www.hamamatsu.com/resources/pdf/etd/SD_tech_TLAs9004E.pdf.

* cited by examiner

FRONT SIDE LASER-BASED WAFER DICING

FIELD

This Disclosure relates to laser-based wafer dicing.

BACKGROUND

Semiconductor die are typically manufactured by dicing a semiconductor substrate generally referred to as being a wafer that is at least 6 inches in diameter (150 mm), such as 8 inches (200 mm) in diameter, or 12 inches (300 mm) in diameter, that comprises a plurality of semiconductor die of a predetermined die size, into a plurality of singulated die. When dicing a wafer, an adhesive dicing tape is attached on a back side surface of the wafer to prevent the die from falling apart, and then the wafer is generally cut from the front side using a mechanical saw to singulate the die. Mechanical dicing saws provide die separations of generally about 40 µm, so that the die separations called scribe streets between the die are made wide enough for such cuts. The scribe streets may include metal containing test structures (e.g., drop-ins). At this time, the dicing tape attached to the back surface of the wafer is slightly cut into its surface but not entirely cut through, and the semiconductor die remain held on the dicing tape. After singulation, a wafer expander is used to provide tape expansion that spreads apart the singulated die to better enable a die picker to pick up die one-by-one from the dicing tape, and are then transferred to a subsequent assembly step such as a die bonding step.

Laser saws for dicing are known as alternative to mechanical dicing saws. Laser saws enable die separations of much less in width as compared to mechanical saws, typically scribe streets only about 2 µm wide. Ablation lasers are known for laser dicing which ablate away substrate material, where the focal point of the laser beam is at the surface of the wafer and substrate material is removed by vaporization during the cutting. "Stealth laser dicers" are also known that utilize a sub-surface wafer treatment using a pulsed laser beam at a wavelength that transmits into the wafer. For silicon wafers, near-infrared (near IR) lasers are used by stealth laser dicers because of the undesired silicon absorption of shorter wavelengths (e.g., visible light) by silicon. Stealth laser dicers always dice the wafer beginning from the back side surface of the wafer due to reasons including needing a different configuration to handle the wafer on a flex frame due different points of contact to transport a frame or wafer, and the need for a new dicing tape or an unconventional backgrind tape on the front side of the wafer that allows for near IR to transmit through it. Also, metal test structures that are generally positioned within the scribe streets will prevent the laser beam from penetrating into the silicon from the front side.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes during conventional stealth laser dicing, because the laser beam is incident on the back side of the wafer, the laser beam can refract off of cracks within the semiconductor substrate (e.g., wafer) formed during the scanning of the laser that disperse the beam which can emerge on the front side of the wafer. The laser beam emerging from the front side of the wafer can cause damage to the active circuitry (e.g., transistors) on the front side of the wafer causing device failures, such as due to electrostatic discharge (ESD) generated damage that can cause short circuits. This refraction and resulting damage to the die on the wafer may be called laser splash. Conventional methods for addressing laser splash adjust the laser dicing recipe by adjusting settings such as the laser power, the pulse frequency, and the laser beam height.

This Disclosure includes a solution to laser splash during conventional stealth laser dicing by having the point of entry of the laser beam be through the active front side of the wafer in the scribe streets as opposed to the conventional backside point of entry of the laser beam in the scribe streets. By disclosed laser scanning with the point of entry for the laser beam being through the front side of the wafer, laser splash if present occurs on the back side of the wafer which avoids ESD damage to the active circuitry, so that one can use a higher laser power since the laser splash occurs on the back side of the wafer opposite to the front side. Higher power laser beams allow for increased die separation ability on relative small area and thick die. Disclosed solutions generally do not decrease throughput or require a lengthy changeover of laser dicer parts.

Disclosed stealth laser dicing methods also leave a traceable mark on the singulated silicon die that evidences entry of the IR laser beam through scribe lines on the front side of a semiconductor die. Thus after disclosed stealth laser dicing, a semiconductor die that includes a substrate having a semiconductor surface layer on a front side with active circuitry that includes at last one transistor therein and a back side, has sidewall edges of the semiconductor die having at least one damage region pair. The damage region pair includes an angled damage feature region relative to a surface normal of the semiconductor die that is above a damage region that is more normal to the surface normal of the die as compared to the angled damage feature region.

BRIEF DESCRIPTION OF THE DRAWINGS

Reference will now be made to the accompanying drawings, which are not necessarily drawn to scale, wherein.

DETAILED DESCRIPTION

Figure 1:
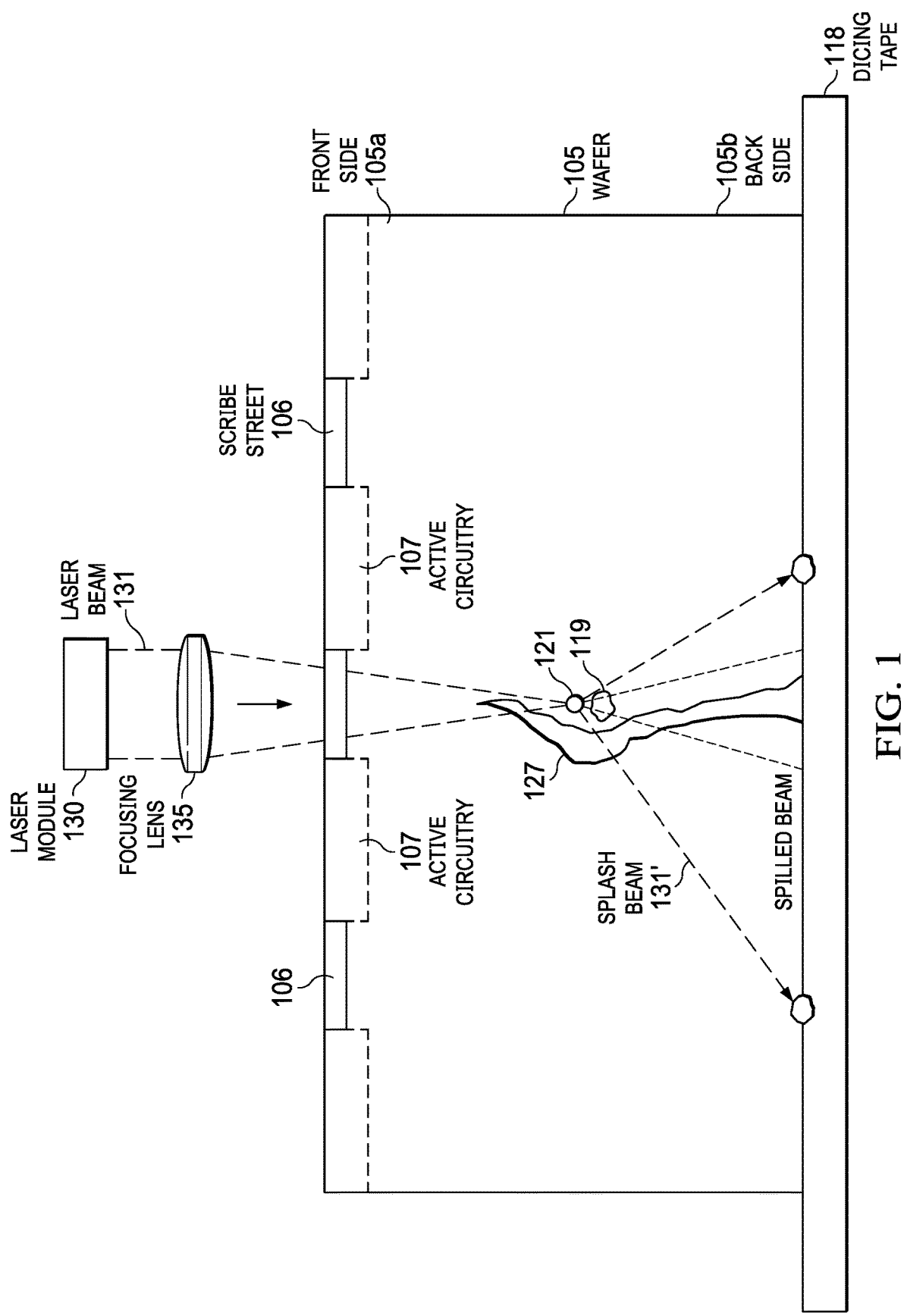
FIG. 1 is depiction of a laser dicing system implementing a disclosed method of front side laser-based wafer dicing, according to an example aspect.

Example aspects in this Disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is depiction of a laser dicing system implementing a disclosed method of front side laser-based wafer dicing, according to an example aspect. The laser dicing system includes a laser module 130 for generating an IR laser beam 131 that is generally a near-IR laser having a modulator for generating a pulsed IR beam, and a focusing lens 135 that may be referred to as a condensing lens. The laser module 130 also generally includes a scanner for scanning the laser beam at a selected scan rate. The laser dicing system is shown lasering a wafer 105 that includes a front side 105a having active circuitry (e.g., transistors) including scribe streets 106 with die comprising active circuitry 107 positioned between the scribe streets 106. The wafer is shown on a dicing tape 118.

The scribe streets 106 are generally exclusive of metal thereon as the scribe streets should be free of any metal because test structures having metal in the scribe street 106 in the beam path will tend to prevent the IR laser beam 131 from reaching the wafer 105, which can comprise silicon or another substrate material. The metal in the scribe streets 106 can be removed prior to laser dicing. Alternatively, the wafer fab can also omit metal in the scribe streets during the fabrication process so that metal removal before laser dicing is not necessary.

However, one can generally also have some 'dummy' fill metal in some portions of the scribe streets for physical stability of the wafer, where the dummy fill metal pattern has gaps of sufficient size that provide a clear path that is metal free for the IR laser beam directed into the gaps to pass through. For example, the dummy fill pattern can include 3 μm metal squares that are in offset rows that have a 3 μm gap between adjacent metal squares. This generally provides a sufficient sized gap for most focused IR laser beams to enter the wafer. Also, in theory one can have a super thin metal layer (e.g., <20 nm thick, such as 5 to 10 nm thick) that may provide a sufficient IR beam transmittance.

The IR laser beam 131 is at a wavelength capable of transmitting through the wafer 105 and is directed so that a point of entry of the laser beam 131 is within the scribe streets 106 on the front side 105a of the wafer. A focal point of the IR laser beam 131 is configured to be embedded within a thickness of the wafer 105 so that laser scanning forms at least one subsurface laser modified region 119 that may be 5 to 15 μm thick. The focal point 121 of the IR laser beam 131 is at the dot shown in FIG. 1. This internal focal point 121 ensures that refracted laser beams shown as splash beam 131' arrive at the back side 105b of the wafer 105 where there is no active circuitry 107 to be damaged. The subsurface laser modified region 119 next to the focal point 121 in the case the wafer 105 is single crystal silicon is polycrystalline with a high dislocation density formed by the rapid melting and solidification of the irradiated region near the focal point 121. Cracks 127 extending to the back side 105b formed by the laser scanning are also shown.

In lasing operation, the IR laser beam 131 is typically pulsed at a frequency of about 50 kHz to 200 kHz, such as 100 kHz, while the wafer 105 is moved relative to the IR laser beam 131 with a velocity of about 0.5 m/sec to 2 m/s. The IR laser beam 131 is scanned to stay within the scribe streets 106 to encircle each die on the wafer 105 with subsurface laser modified regions 119.

Figure 3:
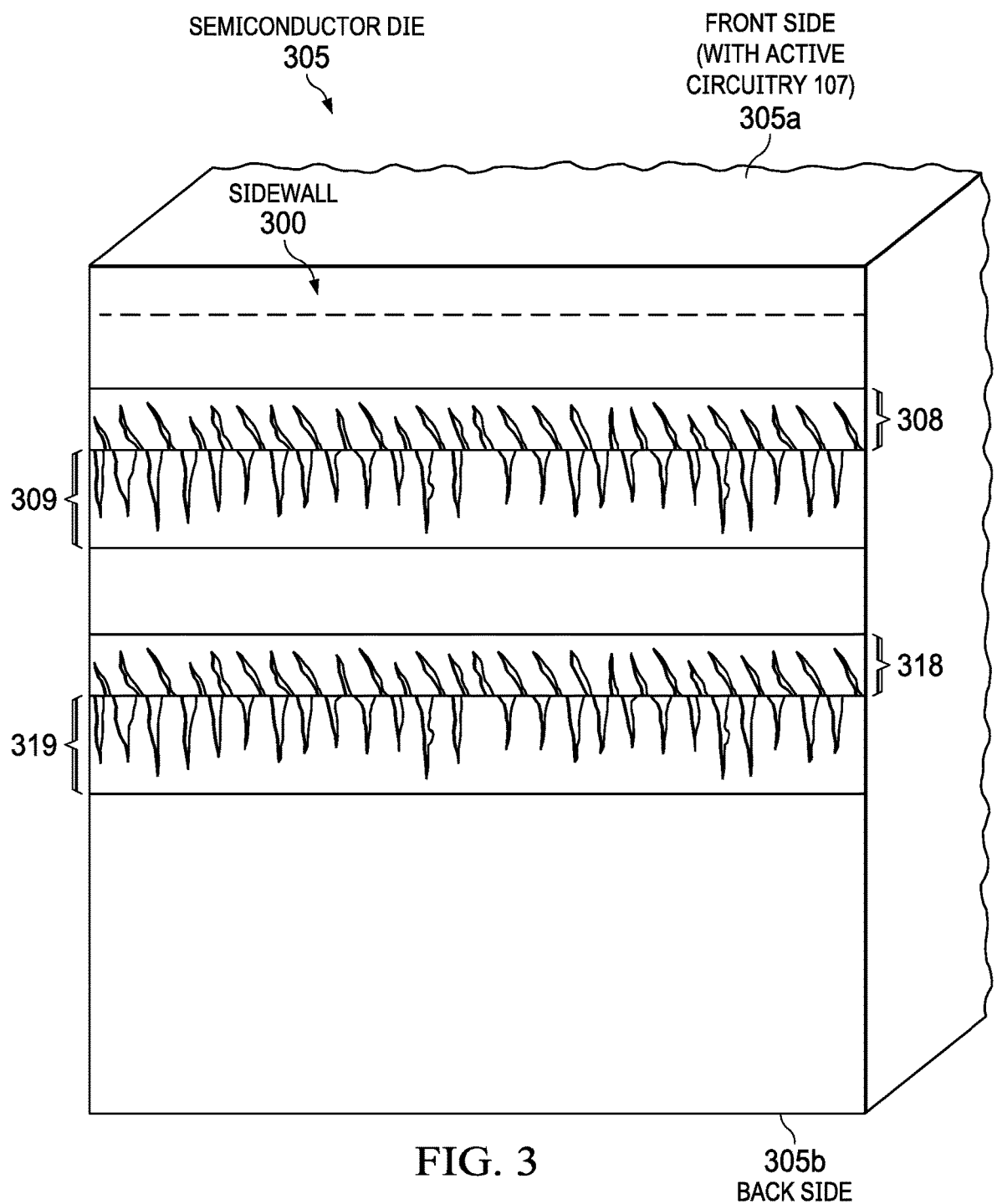
FIG. 3 is a cross sectional depiction of the sidewall of a semiconductor die derived from a transmission electron microscope (TEM) image after being diced by a laser dicer following a disclosed method of front side laser-based wafer dicing followed by singulation by a die expander, according to an example aspect.

The laser module 130 can comprise a pulsed Nd:YAG laser outputting a wavelength of 1,064 nm which can be used for silicon dicing applications because the room temperature band gap of silicon is about 1.11 eV (1,117 nm), so that maximum laser absorption can be adjusted by optical focusing. There can be subsurface laser modified regions formed at two different levels in the wafer 105 as shown in FIG. 3 described below, using first and second laser beams having different incident angles (relative to a top surface of the wafer) used in a single pass, or using a first pass with a first laser beam and a second pass with a second laser beams, where the first and second laser beams have different focal points. Generating two or more damage regions at different depths (see laser damage regions 308/309 above the laser damage regions 318/319 in FIG. 3 described below) may be desirable to provide cracking essentially throughout a thickness of the wafer (if the wafer is thin enough) or to facilitate cracking throughout a thickness of the wafer by a subsequent expanding process. Two or more damaged regions provide more crack propagation as compared to one damage region, which also allows one to separate thicker die. After laser dicing the wafer is generally on a dicing tape 118 which is then expanded in a die expander apparatus to initiate or increase the cracks starting with cracks 127 in the subsurface laser modified regions 119 that propagate along a thickness direction of the wafer 105 to dice the wafer 105 into separate individual ones of the semiconductor die. The wafer 105 is generally not singulated until after die expanding unless it is relatively thin (e.g., <50 μm thick).

The laser module 130 integrated with the optical system including the focusing lens 135 can optionally be incorporated into a dicing machine. For example, Tokyo Seimitsu's Mahoh laser dicing machine (ML200/ML300) and in Disco Corp.'s DFL7340/DFL7360 laser dicing machines. For disclosed aspects no hardware modification of the laser dicer is generally needed.

Disclosed front side laser-based wafer dicing operates as a two-stage process in which embedded defect regions are first introduced into the wafer by scanning an IR laser beam 131 along intended cut lines. Then the wafer on an underlying die attach tape is generally expanded using a wafer frame to induce fracture in the defect regions formed in the first step.

Figure 2:
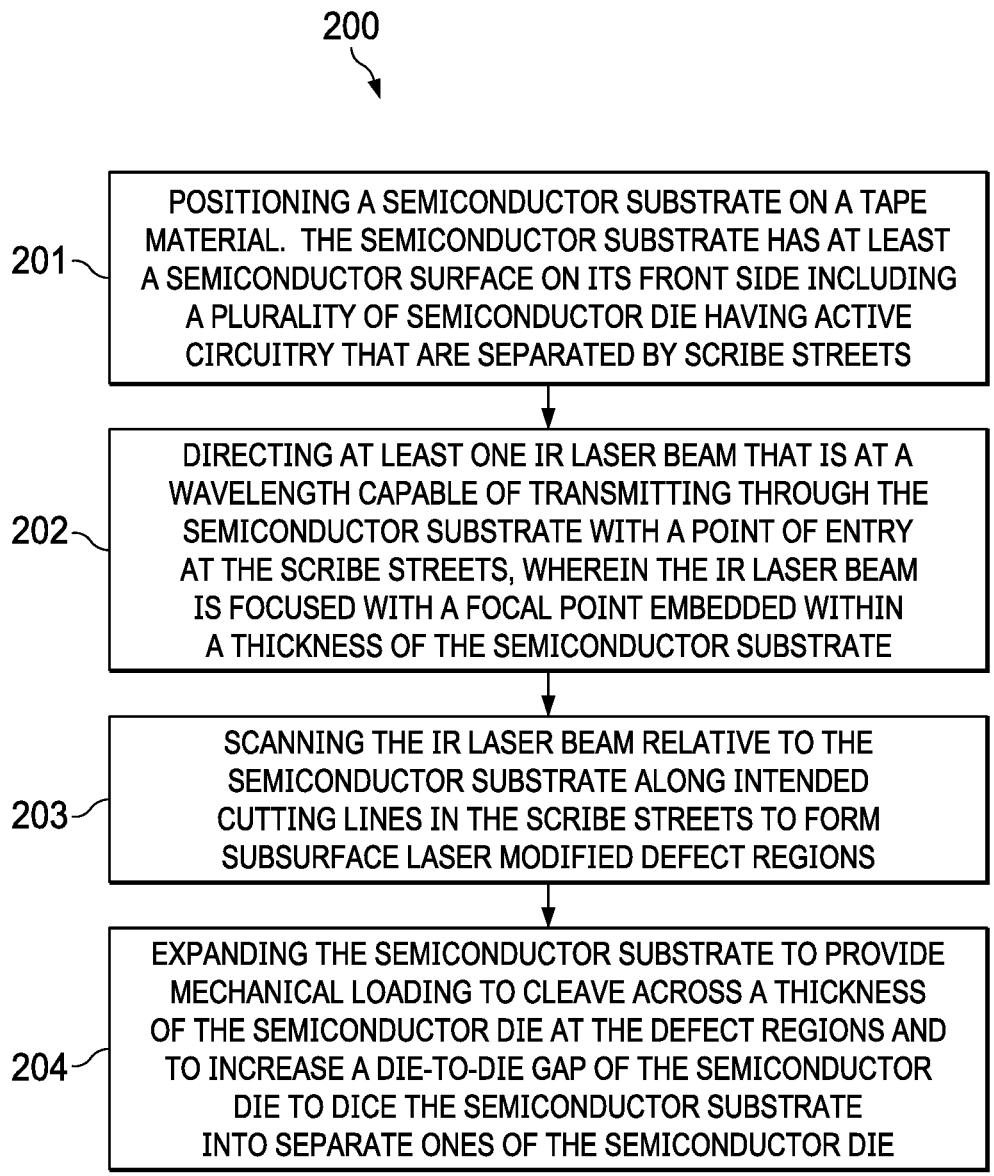
FIG. 2 is a flow chart that shows steps in an example method of front side laser-based wafer dicing.

FIG. 2 is a flow chart that shows steps in an example method 200 of front side laser-based wafer dicing of a semiconductor substrate (e.g., wafer). Step 201 comprises positioning the wafer on a tape material. The tape can be on the front side of the wafer if the wafer material transparent to the IR wavelength used, or the back side of the substrate can be on a tape (dicing or backgrind tape). The wafer has at least a semiconductor surface on its front side 105a including a plurality of semiconductor die having active circuitry on separated by scribe streets 106. The thickness of the wafer is generally 40 μm to 150 μm, which is provided generally following backgrinding. As described above the scribe streets can be exclusive of metal thereon, which can be removed in the fabrication facility or omitted all together.

Step 202 comprises directing at least one IR laser beam that is at a wavelength capable of transmitting through the wafer with a point of entry at the scribe streets 106, wherein the IR laser beam is focused with a focal point embedded within a thickness of the wafer. Step 203 comprises scanning the IR laser beam relative to the wafer along intended cutting lines in the scribe streets to form subsurface laser modified defect regions. Step 204 comprises expanding the wafer to provide mechanical loading to cleave across a thickness of the semiconductor die at the defect regions and to increase a die-to-die gap of the semiconductor die to dice the wafer into separate ones of the semiconductor die.

Semiconductor die after disclosed laser dicing have distinctive features resulting from the IR laser beam's entry from the front side of the semiconductor die. Disclosed semiconductor die after the scanning have sidewall edges having at least one damage region pair comprising an angled damage feature region relative to a surface normal of the semiconductor die that is above a damage region that is more normal to the surface normal of the die as compared to the angled damage feature region. The angled damage feature region has cracks that average at least 5 degrees more relative to the surface normal as compared to cracks in the damage region. These aspects are discussed in FIG. 3 described below.

As described above, because disclosed methods use a point of entry of the IR laser beam 131 from the front side 105*a* of the wafer 105 with the active circuitry 107 between the scribe streets 106, the active circuitry 107 will not risk splash damage regardless of recipe settings, because any splashed material from the splash beam 131' emerges from the back side 105*b* of the wafer 105. Advantages of disclosed solutions include better laser dicing performance since laser splash is no longer a concern, and the laser dicing recipe can be changed to achieve the best separation (higher power) for an increased polysilicon layer size with the fewest passes (higher throughput). Small die capabilities are also improved. Laser dicing is currently limited by minimum die size in part due to achieving separation of the wafer. Recipes with better separation performance will increase the possible die sizes for laser dicing. Laser dicing recipe robustness is also improved. Some devices are more sensitive to laser splash damage than others. This can ensure that if a recipe sees good die separation performance, device sensitivity will not be a factor.

EXAMPLES

Disclosed aspects are further illustrated by the following specific Examples, which should not be construed as limiting the scope or content of this Disclosure in any way.

As noted above, disclosed stealth laser dicing methods leave a traceable mark on the singulated silicon die that evidences entry of the IR laser beam through scribe lines on the front side of a semiconductor die. FIG. 3 is a cross sectional depiction of a sidewall 300 of a semiconductor die 305 comprising silicon having a front side 305*a* with active circuitry 107 extending down to the dashed lines shown, that has a back side 305*b* opposite the front side 305*a*, derived from a TEM image after being diced by a die expander following a disclosed method of front side laser-based wafer dicing, followed by wafer expanding. The sidewall 300 evidences the entry point of the IR laser beam 131 was on the front side 305*a* by showing an angled laser-damage region 308 comprising cracks in largely single crystal silicon that is angled relative to the surface normal of the die and is closer to the front side 305*a* as compared to the laser-damage region 309 under the angled laser-damage region 308 that has damage regions which are more normal to the surface normal of the semiconductor die. The cracks in the angled damage feature region 308 average at least 5 degrees more relative to the surface normal as compared to the cracks in the laser-damage region 309.

Also shown below the laser-damage region 309 is another laser-damage region 318 of cracks in largely single crystal silicon that is angled relative to the surface normal of the semiconductor die 305 that is closer to the front side 305*a* as compared to laser-damage region 319 under the laser-damage region 318 that is more normal to the surface normal of the die. The respective damage regions pairs 308/309 and 318/319 can be formed by using a single IR laser beam that is split into two beams sharing a focal point, but a different incident angle relative to the top surface of the wafer, or by using two separate IR laser beams having different focal points. As described above, having two or more damage regions at different depths may be desirable to provide cracking essentially throughout a thickness of the wafer (if the wafer is thin enough) or to facilitate cracking throughout a thickness of the wafer by a subsequent expanding process.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A method of dicing a semiconductor substrate, comprising:
    positioning the semiconductor substrate directly on a tape material, wherein the semiconductor substrate has at least a semiconductor surface on its front side including a plurality of semiconductor die having active circuitry that are separated by scribe streets, and wherein metal in the scribe streets is removed prior to positioning the semiconductor substrate;
    directing at least one infrared (IR) laser beam that is at a wavelength capable of transmitting through the semiconductor substrate with a point of entry at the scribe streets, wherein the IR laser beam is focused with a focal point embedded within a thickness of the semiconductor substrate; and
    scanning the IR laser beam relative to the semiconductor substrate along intended cutting lines within the scribe streets to form subsurface laser-modified defect regions.

2. The method of claim 1, further comprising after the scanning expanding the semiconductor substrate to provide mechanical loading across a thickness of the semiconductor die at the defect regions to increase a die-to-die gap of the semiconductor die to dice the semiconductor substrate into separate ones of the semiconductor die.

3. The method of claim 2, wherein the expanding utilizes a die matrix expander apparatus having a wafer frame for supporting a dicing tape that the semiconductor substrate is thereon.

4. A method of dicing a semiconductor substrate, comprising
    positioning the semiconductor substrate on a tape material, wherein the semiconductor substrate has at least a semiconductor surface on its front side including a plurality of semiconductor die having active circuitry that are separated by scribe streets;
    directing at least one infrared (IR) laser beam that is at a wavelength capable of transmitting through the semiconductor substrate with a point of entry at the scribe streets, wherein the IR laser beam is focused with a focal point embedded within a thickness of the semiconductor substrate; and scanning the IR laser beam relative to the semiconductor substrate along intended cutting lines within the scribe streets to form subsurface laser-modified defect regions, wherein the scanning IR laser beam results in at least one crack in the semiconductor substrate extending from a location beneath the front side to a back side of the semiconductor substrate, wherein the tape material is on the front side and the tape material does not reflect or absorb the IR laser beam.

5. A method of dicing a semiconductor substrate, comprising:
    positioning the semiconductor substrate directly on a tape material, wherein the semiconductor substrate has at least a semiconductor surface on its front side including a plurality of semiconductor die having active circuitry that are separated by scribe streets;
    directing at leas one infrared (IR) laser beam that is at a wavelength capable of transmitting through the semiconductor substrate with a point of entry at the scribe streets, wherein the IR laser beam is focused with a focal point embedded within a thickness of the semiconductor substrate; and
    scanning the IR laser beam relative to the semiconductor substrate along intended cutting lines within the scribe streets to form subsurface laser-modified defect regions, wherein the tape material is on the front side and the tape material does not reflect or absorb the IR laser beam.

6. The method of claim 1, wherein the subsurface laser-modified defect regions include at least one damage region pair comprising a first damage region that is above a second damage region, wherein the first damage region includes a first set of cracks having a first angle with respect to a plane perpendicular to the semiconductor surface, and the second damage region includes a second set of cracks having a second angle with respect to the plane, the first angle being greater than the second angle.

7. The method of claim 1, wherein the semiconductor substrate comprise silicon and wherein the wavelength is 900 nm to 1,500 nm.

8. The method of claim 1, wherein the at least one IR laser beam comprises a first IR laser beam and a second IR laser beam that are configured with different ones of the focal points, and wherein the directing comprises a single pass.

9. The method of claim 1, wherein the at least one IR laser beam comprises a first IR laser beam from a first laser and a second IR laser beam from a second laser that are configured with different ones of the focal points, wherein the directing comprises a first pass with the first IR laser beam and a second pass with the second IR laser beam.

10. The method of claim 1, wherein the directing and the scanning of the IR laser beam is exclusively with the point of entry at the scribe streets.

11. The method of claim 1, wherein the scanning comprises multiple scans.

12. The method of claim 1, wherein the IR laser beam is pulsed at a frequency of 50 kHz to 200 kHz.

13. The method of claim 1, wherein the scanning the IR laser beam results in at least one crack in the semiconductor substrate extending from a location beneath the front side to a back side of the semiconductor substrate.

14. A method of dicing a semiconductor substrate, comprising:
    positioning the semiconductor substrate directly on a tape material, wherein the semiconductor substrate has at least a semiconductor surface on its front side including a plurality of semiconductor die having active circuitry that are separated by scribe streets, and wherein metal in the scribe streets is removed prior to positioning the semiconductor substrate;
    directing at least one infrared (IR) laser beam that is at a wavelength capable of transmitting through the semiconductor substrate with a point of entry at the scribe streets, wherein the IR laser beam is focused with a focal point embedded within a thickness of the semiconductor substrate; and
    scanning the IR laser beam relative to the semiconductor substrate along intended cutting lines within the scribe streets to form subsurface laser-modified defect regions, wherein the subsurface laser-modified defect regions include at least one damage region pair comprising a first damage region that is above a second damage region, wherein the first damage region includes a first set of cracks having a first angle with respect to a plane perpendicular to the semiconductor surface, and the second damage region includes a second set of cracks having a second angle with respect to the plane, the first angle being greater than the second angle by at least 5 degrees.

15. A method of dicing a semiconductor substrate, comprising:
    positioning the semiconductor substrate directly on a tape material, wherein the semiconductor substrate has at least a semiconductor surface on its front side including a plurality of semiconductor die having active circuitry that are separated by scribe streets, wherein me n the scribe streets removed prior to positioning the semiconductor substrate;
    directing at least one infrared (IR) laser beam that is at a wavelength capable of transmitting through the semiconductor substrate with a point of entry at the scribe streets, wherein the IR laser beam is focused with a focal point embedded within a thickness of the semiconductor substrate; and
    scanning the IR laser beam relative to the semiconductor substrate along intended cutting lines within the scribe streets to form subsurface laser-modified defect regions,
    wherein the at least one IR laser beam comprises a first IR laser beam and a second IR laser beam that are configured with different ones of the focal points.

16. A method of dicing a semiconductor substrate, comprising:
    positioning the semiconductor substrate on a tape material, wherein the semiconductor substrate has at least a semiconductor surface on its front side including a plurality of semiconductor die having active circuitry that are separated by scribe streets, and wherein metal in the scribe streets is removed prior to positioning the semiconductor substrate;
    directing at least one infrared (IR) laser beam that is at a wavelength capable of transmitting through the semiconductor substrate with a point of entry at the scribe streets, wherein the IR laser beam is focused with a focal point embedded within a thickness of the semiconductor substrate; and
    scanning the IR laser beam relative to the semiconductor substrate along intended cutting lines within the scribe streets to form subsurface laser-modified defect regions, wherein the scanning the IR laser beam results in at least one crack in the semiconductor substrate extending from a location beneath the front side to a back side of the semiconductor substrate.

17. The method of claim 16, further comprising after the scanning expanding the semiconductor substrate to provide mechanical loading across a thickness of the semiconductor die at the defect regions to increase a die-to-die gap of the semiconductor die to dice the semiconductor substrate into separate ones of the semiconductor die.

18. The method of claim 16, wherein the subsurface laser-modified defect regions include at least one damage region pair comprising a first damage region that is above a second damage region, wherein the first damage region includes a first set of cracks having a first angle with respect to a plane perpendicular to the semiconductor surface, and the second damage region includes a second set of cracks having a second angle with respect to the plane, the first angle being greater that the second angle.

* * * * *